(12) United States Patent
Lowe et al.

(10) Patent No.: US 6,849,510 B2
(45) Date of Patent: *Feb. 1, 2005

(54) NON-OXIDIZING SPACER DENSIFICATION METHOD FOR MANUFACTURING SEMICONDUCTOR DEVICES

(75) Inventors: Brett D. Lowe, Boise, ID (US); John A. Smythe, Boise, ID (US); Timothy K. Carns, Meridian, ID (US)

(73) Assignee: ZiLOG, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/667,919

(22) Filed: Sep. 22, 2003

(65) Prior Publication Data

US 2004/0072397 A1 Apr. 15, 2004

Related U.S. Application Data

(63) Continuation of application No. 09/918,364, filed on Jul. 30, 2001, now Pat. No. 6,642,112.

(51) Int. Cl.[7] .......................................... H01L 21/8234
(52) U.S. Cl. ...................................... 438/275; 257/351
(58) Field of Search ................................. 438/275, 199, 438/595; 257/351

(56) References Cited

U.S. PATENT DOCUMENTS

| | | |
|---|---|---|
| 5,089,432 A | 2/1992 | Yoo |
| 5,130,266 A | 7/1992 | Huang et al. |
| 5,214,305 A | 5/1993 | Huang et al. |
| 5,422,311 A | 6/1995 | Woo |
| 5,434,096 A | 7/1995 | Chu et al. |
| 5,541,131 A | 7/1996 | Yoo et al. |
| 5,554,566 A | 9/1996 | Lur et al. |
| 5,599,746 A | 2/1997 | Lur et al. |
| 5,710,454 A | 1/1998 | Wu |
| 5,869,378 A | 2/1999 | Michael |
| 5,946,599 A | 8/1999 | Lee et al. |
| 5,986,312 A | 11/1999 | Kuroda |
| 6,040,238 A | 3/2000 | Yang et al. |
| 6,098,304 A | 8/2000 | Manjkow et al. |
| 6,146,970 A | 11/2000 | Witek et al. |
| 6,156,653 A | 12/2000 | Smythe et al. |
| 6,165,846 A | 12/2000 | Carns et al. |
| 6,190,973 B1 | 2/2001 | Berg et al. |
| 6,448,167 B1 * | 9/2002 | Wang et al. ................. 438/595 |

OTHER PUBLICATIONS

Krishna Seshan et al., "The Quality and Reliability of Intel's Quarter Micron Process," Intel Technology Journal Q3'98, pp. 1–11.

Y. G. Shen et al., "Oxygen–induced amorphous structure of tungsten thin films," Applied Physics letters, vol. 75, No. 15, Oct. 11, 1999, pp. 2211–2213.

Alain P. Blosse, "Improved Thermal Stability of CVD Wsi, During Furnace Oxidation By A Rapid Thermal Anneal Pretreatment," Mat. Res. Soc. Symp. Proc. vol. 525, 1998 Materials Research Society, pp. 371–377.

M. Doscher et al., "A study of $WSi_2$ Thin Films, Formed By The Reaction Of Tungsten With Solid Or Liquid Silicon, By Rapid Thermal Annealing," Thin Solid Films, 1994, pp. 251–258.

C.J. Backhouse et al., "$WSi_x$ Thin Films For Resistors," Thin Solid Films, 1997, pp. 299–303.

(List continued on next page.)

Primary Examiner—David Nelms
Assistant Examiner—Quoc Hoang

(57) ABSTRACT

Non-oxidizing spacer densification method for producing semiconductor devices, such as MOSFET devices, and that may be implemented during semiconductor fabrication with little or substantially no polycide adhesion loss experienced during spacer densification. The method may be implemented to provide good polycide adhesion characteristics with reduced process complexity over conventional methods by eliminating the need for additional process steps such as metal silicide encapsulation or polysilicon surface treatments.

41 Claims, 6 Drawing Sheets

OTHER PUBLICATIONS

A Fabricius et al., "Rapid Thermal Annealing Of Tungsten Silicide Films," Mat. Res. Soc. Symp. Proc. vol. 402, 1996, Materials Research Society, pp. 625–630.

J. P. Gambino et al., "Thermal Stability of $WSi_2$ Polycide Structures For 1Gbit DRAMs," IEEE, 1998, pp. 259–261.

J. P. Gambino et al., "Reaction of Ti with $WSi_2$," American Institute of Physics, J. App. Phys. 82(12) Dec. 15, 1997, pp. 6073–6077.

V. G. Glebovsky et al., "Properties of Tungsten Silicide Thin Films Obtained By Magnetron Sputtering Of Composite Cast Targets," Materials Research Society Symposium Proceedings, vol. 402, Nov. 27–30, 1995, 4 pgs.

Tohru Hara et al., "Properties of Sputtered Tungsten Silicide Films Deposited With Different Argon Pressures," Nuclear Instruments and Methods In Physics Research, B39, 1989, pp. 302–305.

H. Hayashida et al., "Dopant Redistribution In Dual Gate W–Polycide CMOS And Its Improvement By RTA," Semiconductor Device Engineering Laboratory, Integrated Circuit Division, Toshiba Corporation, 1989, 2 pgs.

Hoi Chung et al., "Effects Of The Phosphorus Doping Level And Excess Silicon On The Oxidation Of Tungsten Polycide," Journal of the Korean Physical Society, vol. 29, No. 5, Oct. 1996, pp. 658–663.

Masahiro Itoh et al., "Observation Of Microstructure At The Polycrystalline Silicon And Tungsten Silicide Interface," Applied Surface Science, 56–58, 1992, pp. 540–544.

Seiichi Iwata et al., "Evaluation Of Adherence Of CVD Tungsten Silicide Film To Polycrystalline Silicon," Materials Transactions, JIM, vol. 30, No. 6, 1989, pp. 403–410.

Takamaro Kikkawa et al., "0.35 $\mu$m Technologies In Japan," ULSI Device Development Laboratories, Materials Research Society, Mat. Res. Soc. Symp. Proc. Vol. 402, 1996. pp. 199–208.

E.M. King et al., "Tungsten Rich Silicide/Polysilicon (polycide) For MOS Gates And Interconnections," J. Vac. Sci. Technol. A 1(2), Apr.–Jun. 1983, pp. 614–615.

Muh Ling Ger et al., "Sputtered $WSi_x$ for Micromechanical Structures," Materials Research Society, J. Mater. Res. vol. 10, No. 7, Jul. 1995, pp. 1710–1720.

Yoji Mashiko et al., "Formation Mechanisms Of The Deformed Oxide Layer In A Tungsten Polycide Structure," Jpn. J. Appl. Phys. vol. 35, Part 1, No. 2A, Feb. 1996, pp. 584–588.

F. Mohammadi et al., "Properties Of Sputtered Tungsten Silicide For MOS Integrated Circuit Applications," J. Electrochem, Soc. Solid–State Science and Technology, Feb. 1980, pp. 450–454.

F. Mohammadi et al., "Kinetics Of The Thermal Oxidation of $WSI_2$," American Institute of Physics, Appl. Phys. Lett. 35(7), Oct. 1979, pp. 529–531.

W. Pletschen et al., "Properties Of Sequentially Sputtered Tungsten Silicide Thin Films," Applied Surface Science 38, 1989, pp. 259–268.

Krishna Shenai et al., "Structural And Electrical Properties Of Furnace And Rapid Thermally Annealed LPCVD $WSi_2$ Films On Single–Crystal, Polycrystalline, And Amorphous Silicon Substrates," IEEE Transactions On Electron Devices, vol. 39, No. 1, Jan. 1992, pp. 193–199.

M.P. Siegal et al., "The Formation Of Thin–Film Tungsten Silicide Annealed In Ultrahigh Vacuum," America Institute of Physics, J. Appl. Phys. 66(12), Dec. 1989, pp. 6073–6076.

A.K. Sinha, "Refractory Metal Silicides For VLSI Applications," American Vacuum Society, J. Vac. Sci. Technol., 19(3), Sep.–Oct. 1981, pp. 778–785.

John Smythe et al., "A Structural And Bonding Perspective Of The Anomalous Oxidation Of Tungsten Polycide," MSE510 Term Project Paper, Dec. 9, 2000, 17 pgs.

H. Tsutsui et al., "Suppression Of Partial Corrosion Of Sputtered Wsix Gate In HF Solution," Electrochemical Society Proceedings, vol. 96–2, 1996, pp. 226–232.

Chue–san Yoo et al., "Si/W Ratio Changes And Film Peeling During Polycide Annealing," vol. 29, No. 11, Nov., 1990, pp. 2535–2540.

Chapter 11: "Refractory Metals and Their Silicides in VLSI Fabrication," Silicon Processing for the VLSI Era, 1986, pp. 384–406.

George E. Georgiou, Chapter 2: "Silicides and Contacts for ULSI," Multilevel Metallization for Integrated Circuits, pp. 32–91.

S. M. Sze, "p–n Junction Diode," Physics of Semiconductor Devices, Second Edition, Ch. 2, 1981, pp. 63–132.

J.C. Dupuy et al., "Dopant Redistribution During The Formation Of Tungsten Disilicide By Rapid Thermal Processing," Materials Science and Engineering, B22 (1994), pp. 168–171.

S. L. Zhang et al., "The Influence of Substrate Doping On Silicide Formation With Tungsten Deposited From Tungsten Hexafluoride," Mat. Res. Soc. Symp. Proc. vol. 260, Materials Research Society, 1992, pp. 411–416.

C. B. Cooper III et al., "Dopant Redistribution in Silicides: Materials and Process Issues," J. Vac. Sci. Technol. B2 (4), Oct.–Dec. 1984, 1984 American Vacuum Society, pp. 718–722.

Tae–Hyung Kim et al., "LPCVD $WSi_x$/poly–Si W–polycide, The Properties of W–Polycide On Thickness Changes of the $WSi_x$/poly–Si Films Deposited By LPCVD," Trans. KIEE, vol. 41, No. 10, Oct. 1992, pp. 1172–1 179.

S. Nygren et al., "Dopant Redistribution From Ion Implanted $WSi_2$ On Poly–Si," Elsevier Science Publishers B. V. (North–Holland), 1988, pp. 419–422.

F. C. Shone et al., "Modeling Dopant Redistribution in $SiO_2/WSi_2$/Si Structure," 536–IEDM 86, Dec. 1986, 4 pgs.

J. Torres et al., "Phosphorus Redistribution in a $WSi_2$/Poly–Si Gate Structure During Furnace Annealing," Mar. 1987, 4 pgs.

Chongmu Lee et al., "Effects of the Annealing Treatment on the Oxidation Behaviors of Tungsten Silicide," Korean Applied Physics (Korean Physical Society) vol. 3, No. 2, May 1990, pp. 235–240.

Hoi Hwan Chung et al., "poly–Si/$SiO_2$/Si—Study on Formation of W–Silicide in the Doped– Phosphorus poly–Si/$SiO_2$/Si–Substrate," Dept. of Electronic Eng., Kyunghee Univ., Div. of Elec. & Infor. Technology, KIST, 1996, pp. 126–134.

Copending U.S. Appl. No. 09/918,364, filed Jul. 30, 2001 (ZILG:518/ZILO:002) which is relied upon by the present application for an earlier effective filing date under 35 U.S.C. Section 120.

* cited by examiner

NON-OXIDIZING SPACER DENSIFICATION METHOD FOR MANUFACTURING SEMICONDUCTOR DEVICES

This is a continuation of U.S. patent application Ser. No. 09/918,364 filed on Jul. 30, 2001, now U.S. Pat. No. 6,642,112 and entitled "NON-OXIDIZING SPACER DENSIFICATION METHOD FOR MANUFACTURING SEMICONDUCTOR DEVICES" by Lowe, et al.

BACKGROUND OF THE INVENTION

The present invention relates generally to semiconductor devices, and more particularly to metal-oxide-semiconductor ("MOS") devices.

In the manufacture of semiconductor devices conductive polycide is often employed to impart enhanced conductivity to conductive layers. Polycide is a combination of polysilicon and refractory metal silicide layers that offers lower resistivity than polysilicon alone. Polycides may be formed using silicides of a variety of refractory metals including, but not limited to, metals such as titanium, tungsten, tantalum, molybdenum, etc. In one common example, the silicidation of polysilicon (e.g., to form polycide) has been previously implemented to reduce the electrical resistance of gate electrode and interconnect metallization in metal-oxide-semiconductor field effect transistor ("MOSFET") devices.

Polycides may be formed in a number of different ways including, for example, by depositing a refractory metal onto a polysilicon layer, followed by annealing at a sufficiently high temperature to form a metal silicide. Alternatively, metal silicide may be deposited, for example, by using sputtering, low pressure chemical vapor deposition ("LPCVD"), evaporation, etc. In one example of the latter method, U.S. Pat. No. 5,946,599 describes LPCVD deposition of tungsten silicide onto doped-polysilicon.

Although various methods and improvements thereto have been developed for the fabrication of conductive polycide, problems in the fabrication of polycides still exist. For example, one major problem commonly experienced with existing polycide fabrication technologies is lack of adhesion between the metal silicide layer and the polysilicon layer. This lack of adhesion, or adhesion loss, may result in separation or peeling of a refractory metal silicide layer from an underlying polysilicon layer, translating to lowered product yield.

Attempts have been made to address adhesion problems encountered with polycide layers, such as those encountered during fabrication of MOSFET devices. For example, U.S. Pat. No. 5,089,432 describes encapsulation of a polycide layer with a tetraethoxysilane ("TEOS") deposited silicon dioxide dielectric layer which is preserved above the polycide layer via masking during spacer etch to improve adhesion. In another example, U.S. Pat. No. 5,946,566 proposes improving adhesion between metal silicide and polysilicon layers by deposition of a polysilicon layer having a wavy or undulated surface, i.e., hemi-spherical grain ("HSG") polysilicon or acid-treated polysilicon. Drawbacks associated with such methods include increased cost and process complexity. Further, encapsulation of polycide requires very tight control of spacer densification conditions, e.g., to maintain a very controlled oxidation environment in a furnace tube, in order to maintain the integrity of the encapsulation.

SUMMARY OF THE INVENTION

Disclosed herein is a non-oxidizing spacer densification method for producing semiconductor devices including, but not limited to, MOSFET devices such as fully integrated complementary metal-oxide semiconductor ("CMOS") devices having non-volatile memory. Advantageously, the disclosed method may be implemented during semiconductor fabrication to provide low cost and robust processes for polycide formation with little or substantially no adhesion loss experienced during spacer oxide densification steps. The disclosed method also makes possible good polycide adhesion characteristics with reduced process complexity over conventional methods by eliminating the need for additional process steps such as metal silicide encapsulation or polysilicon surface treatments. The disclosed method further simplifies the spacer oxide densification step and process sequence since no thermal oxide is grown over the non-volatile memory stack structure, non-memory control gate stack structure and source/drain regions during spacer densification, eliminating the need to manage thermal oxide growth during this step. Further, the disclosed non-oxidizing method may be used to achieve MOSFET spacer oxide densification while at the same time minimizing or substantially preventing off-site oxide growth loss due to oxidation of exposed silicon surfaces during the densification step.

By employing non-oxidizing species in a MOSFET spacer densification step, the disclosed method surprisingly eliminates the need for the added complexity of a metal silicide top encapsulation layer and the need for controlled oxidation conditions during spacer densification employed in the practice of conventional MOSFET fabrication methods without detrimental effects on the performance of MOSFET transistors. This method of fabrication is contrary to accepted MOSFET spacer densification methodology that employs oxidizing species to grow a thin layer of silicon dioxide in the source and drain areas during spacer densification before, for example, deposition of polysilicon metal dielectric layers.

Thus, in one embodiment, the disclosed method may be practiced to minimize or substantially eliminate undesirable growth of oxidation products (e.g., $W_xSi_yO_2$ on tungsten-based polycide layers) that are believed to result in polycide adhesion loss, and implementation of MOSFET spacer densification in a non-oxidizing environment eliminates the need for encapsulation methods to prevent polycide adhesion loss. Further, the disclosed method makes the spacer etch step substantially completely tolerant or independent of micro-loading effects, i.e., differences in amount of anti-reflective layer that is removed from the top of the polycide layer during spacer etch steps. In this regard, the disclosed method may be successfully practiced under conditions ranging from substantially no removal of anti-reflective layer during spacer oxide etch to almost complete removal of anti-reflective layer during spacer oxide etch (e.g., only a few mono-layers of anti-reflective layer remaining). This characteristic advantageously reduces expense and complexity of the spacer oxide etch step.

Advantageously, the disclosed method may be further implemented in a low cost manner to fabricate high yield and high reliability polycide layers in an existing MOSFET fabrication unit. In this regard, the disclosed method may be implemented in a manner that reduces necessary capital investment by using existing physical vapor deposition ("PVD") equipment for the sputter deposition of metal silicide, e.g., by addition of a sputter chamber to existing PVD equipment. Additional cost savings may be realized by using rapid thermal processing ("RTP") methodology, e.g., low DT (e.g. time at temperature), rather than slow controlled furnace tube oxidizing anneal methodologies that are employed in conventional spacer densification methods.

Further cost advantages may be realized using the disclosed method by employing plasma enhanced chemical vapor deposition ("PECVD") for anti-reflective layer ("ARL") deposition rather than using the costlier spin-on deposition of ARL.

In one respect then, disclosed herein is a method of densifying a spacer oxide that at least partially surrounds a polycide structure. The method includes densifying the spacer oxide in a non-oxidizing ambient.

In another respect, disclosed herein is a method of forming a semiconductor structure on a substrate. The method may include forming a polycide structure having at least one polysilicon layer and at least one metal silicide layer, forming a spacer oxide on the polycide structure to at least partially surround the polycide structure, and densifying the spacer oxide in a non-oxidizing ambient to form the semiconductor structure.

In another respect, disclosed herein is a method of forming a non-volatile memory stack structure and a non-memory control gate stack structure of an integrated semiconductor device on a silicon substrate. The method may include forming a dielectric isolation region on the silicon substrate between an active non-volatile memory mesa area and an active non-memory mesa area of the silicon substrate, forming a memory cell oxide layer on the silicon substrate over the active non-volatile memory mesa area, forming a doped floating gate polysilicon layer on the memory cell oxide layer over the active non-volatile memory mesa area, forming an inter-poly oxide layer on the doped floating gate polysilicon layer over the active non-volatile memory mesa area, forming a thin gate oxide layer on the silicon substrate over the active non-memory mesa area, forming a doped control gate polysilicon layer on the thin gate oxide of the active non-memory mesa area and on the inter-poly oxide layer of the active non-volatile memory mesa area, forming a refractory metal silicide layer on the doped control gate polysilicon layer over the active non-volatile memory mesa area so as to form said non-volatile memory stack structure over the active non-volatile memory mesa area, and forming heavily doped non-volatile memory source/drain regions of the non-volatile memory stack structure in the silicon substrate over the active non-volatile memory mesa area. The method may also include forming a refractory metal silicide layer on the doped control gate polysilicon layer over the active non-memory mesa area so as to form said non-memory control gate stack structure over the active non-memory mesa area, and forming lightly doped non-memory source/drain regions of the non-memory control gate stack structure in the silicon substrate over the active non-memory mesa area. The method may further include forming a spacer oxide side layer on each of the non-volatile memory stack and the non-memory control gate stack structures, densifying the spacer oxide side layers in a non-oxidizing ambient; and forming heavily doped non-memory source/drain regions of the non-memory control gate stack structure in the silicon substrate over the lightly doped non-memory source/drain regions.

In another respect, disclosed herein is a relatively low cost and high yielding method for the integration of tungsten polycide deposition into an existing CMOS fabrication facility. In one embodiment, the method may combine the physical vapor deposition ("PVD") or sputter deposition of a tungsten polycide layer, plasma enhanced chemical vapor deposition ("PECVD") of a silicon oxynitride anti-reflective layer ("ARL"), and rapid thermal processor spacer densification in the presence of a non-oxidizing species (e.g., nitrogen) to produce a non-encapsulated polycide layer having good adhesion characteristics. In this embodiment, RTP in a non-oxidizing nitrogen environment advantageously may be employed to achieve spacer densification without the need for encapsulation methods to prevent polycide adhesion loss.

In another respect, disclosed is a method of fabricating a tungsten polycide interconnection layer in a fully integrated CMOS device having embedded analog sections and non-volatile memory sections. In one exemplary embodiment, the method may include first depositing a layer of amorphous silicon by, for example, low pressure chemical vapor deposition ("LPCD"), subsequently doping the deposited layer by, for example, ion implantation, followed by annealing the deposited and doped layer using, for example, RTP to activate the dopant and to reduce damage. The method may next include depositing a tungsten silicide layer on the doped amorphous silicon by, for example, using PVD followed by RTP of the tungsten silicide layer in a nitrogen environment to form a tungsten-based polycide structure. The method may next include depositing a silicon-rich oxynitride layer onto the tungsten-based polycide structure to serve as a polycide ARL for the patterning process using, for example, PECVD deposition. Non-volatile memory and control gate polycide stack structures may next be fabricated, for example, by patterning the tungsten-based polycide structure using photolithography followed by reactive ion etch ("RIE") processes, and a thin oxide may be subsequently grown on the sidewalls of non-volatile memory and control gate polycide stacks, for example, within a furnace tube. Source and drain areas may next be n-doped and/or p-doped to provide desired functionality. The method may next include depositing an oxide spacer layer using, for example, PECVD tetraethyl orthosilicate ("TEOS") deposition. The spacer layer may next be removed and over-etched from the top of the polycide and from the source and drain areas using, for example, RIE. Densification of the spacer and tungsten-based polycide structure may then be accomplished using RTP and a non-oxidizing environment in order to prevent polycide oxidation induced peeling.

DESCRIPTION OF ILLUSTRATIVE EMBODIMENTS

The disclosed method may be used in the fabrication of any semiconductor device employing a polycide layer and during the fabrication of which a subsequent spacer densification step is employed. Examples of such semiconductor devices include, but are not limited to, MOSFET devices such as memory devices, microprocessors, logic devices, etc. Examples of memory devices include, but are not limited to, ROM devices, DRAM devices, SRAM devices, etc. Specific examples of non-volatile memory devices include, but are not limited to, EPROM devices, EEPROM devices, one time programmable ("OTP") devices, etc. Using the disclosed method, high yielding and reliable MOSFET devices may be manufactured using a spacer densification step performed in the substantial absence of oxidizing species.

FIGS. 1–7 illustrate one exemplary embodiment of the disclosed method that may be employed to produce MOSFET devices having embedded non-volatile memory on a substrate. As referred to herein, a "substrate" may be any semiconductor substrate including, but not limited to, a semiconductor wafer substrate such as silicon or GaAs. In this regard, a substrate may include a semiconductor wafer or a semiconductor wafer having one or more process layers formed on the wafer. Although the process of FIGS. 1–7 is described with reference to formation of a MOSFET device on a p-type substrate, it will be understood by those of skill in the art that silicon substrate 100 may alternatively be an n-type substrate, and that processing steps (e.g., implantation, dopant types, etc.) may be adjusted accordingly to form a MOSFET device thereon.

Figure 1:
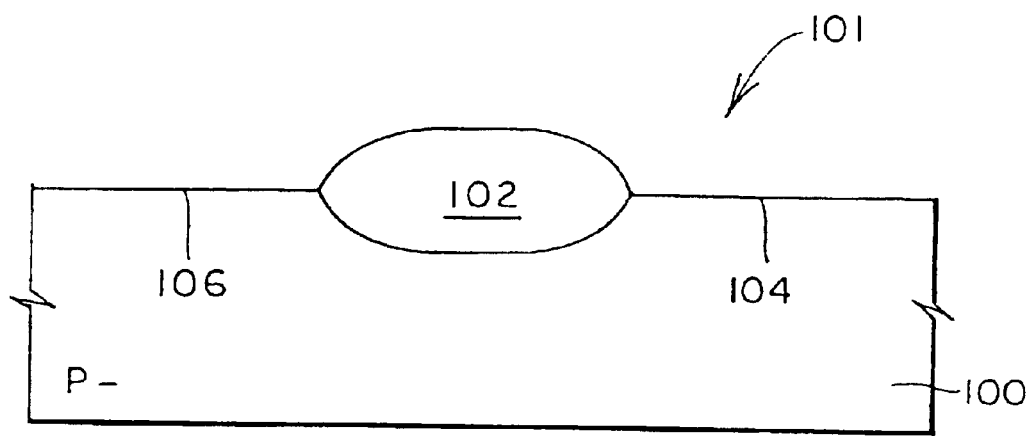
FIG. 1 is a simplified partial cross-sectional view of a semiconductor substrate having a dielectric isolation region formed thereon according to one embodiment disclosed herein.

FIG. 1 illustrates dielectric isolation region 102 formed upon a p-type silicon substrate 100 of a semiconductor device 101. In one embodiment, silicon substrate 100 may have a crystallographic orientation of about 100, although other orientation values are possible. Dielectric isolation region 102 may be formed on substrate 100 using, for example, a conventional selective local oxidation of silicon ("LOCOS") process. In this regard, formation of dielectric isolation region 102 by a LOCOS process may be accomplished, for example, by masking active mesa areas 104 and 106 of silicon substrate 100 and oxidizing exposed area 102 of substrate 100 to grow a thermal oxide 102 on and into the surface of substrate 100, resulting in a sunken silicon dioxide dielectric isolation region 102 surrounded by active mesa regions 104 and 106. As shown in FIG. 1, dielectric isolation region 102 separates active non-volatile memory mesa area 104 from active non-memory mesa area 106. It will be understood with benefit of this disclosure that the disclosed method is not limited to specific LOCOS processes, and may be implemented independent of the specific isolation region characteristics. Further, the isolation region 102 need not be formed by a LOCOS process, but rather may be formed by any other suitable isolation process. For example, a shallow trench isolation ("STI") process as known to those skilled in the art may be employed.

For ease of illustration, an exemplary active mesa area 104 is shown for use in forming memory sections of device 101, and an exemplary active mesa area 106 is shown for use in forming non-memory sections of device 101. However, it will be understood with benefit of this disclosure by those of skill in the art that it is not necessary that both memory sections and non-memory sections be present, and that benefits of the disclosed method may be realized in the fabrication of any MOSFET device, including devices having only memory sections, only non-memory sections, etc. It will also be understood that a wide variety of different MOS type devices may be fabricated using the disclosed method including, but not limited to, CMOS devices, BiCMOS devices, NMOS devices, PMOS devices, etc. In this regard, it will be understood that control gate structures having opposite channel conductivity types may be present on the same device to implement CMOS transistor logic. For example, to implement CMOS in the device of the exemplary embodiment of FIGS. 1–7, p-channel transistors (not shown) may also be present on device 101 and formed by use of an n-well implant in p-type substrate 100. It will be understood that in some embodiments it is possible that other structures may be present on a given device, e.g., embedded analog circuits including poly-to-poly capacitors, poly-to-substrate capacitors, and resistors. Further, it will be understood that in other embodiments it is possible that MOSFET control gate structures may be present on a given device to perform a variety of other functions known in the art, e.g., as part of embedded analog capacitor circuitry, etc.

Figure 2:
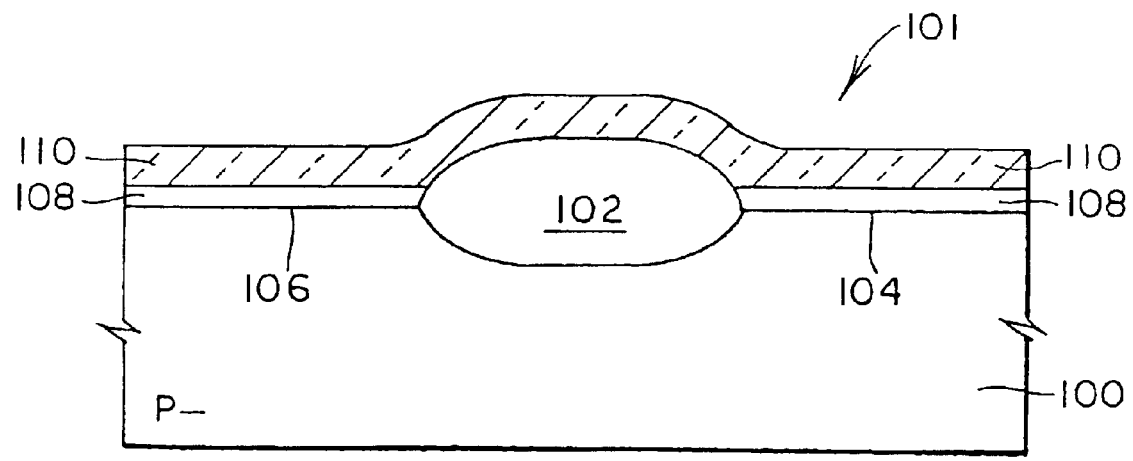
FIG. 2 is a simplified partial cross-sectional view of the semiconductor substrate or FIG. 1 having a memory cell oxide layer and formed thereon according to one embodiment disclosed herein.

As shown in FIG. 2, memory cell oxide layer 108 may be formed by thermally oxidizing the silicon of active mesa areas 104 and 106. Memory cell oxide layer 108 may be of any suitable thickness, however, in one embodiment is grown to a thickness from about 100 to about 350 angstroms thickness, although other thicknesses are possible.

Still referring to FIG. 2, a first amorphous silicon layer may next be deposited as a blanket covering the surface of substrate 100 using, for example, a conventional thermal LPCVD method. Although any suitable deposition temperature and layer thickness may be employed, in one embodiment a deposition temperature of between about 500° C. and about 550° C. may be used to form an amorphous silicon layer having a thickness of between about 1500 angstroms and about 2500 angstroms. Next, the amorphous silicon layer may be doped with phosphorous or other suitable dopant. In one exemplary embodiment the amorphous silicon layer may be phosphorous-doped using any suitable method, for example, ion implantation or soaking in $POCl_3$, followed by dopant redistribution and crystallization anneal at suitable conditions to form first doped floating gate polysilicon layer 110, for example, using RTP at a temperature of between about 850° C. and about 950° C. for a time period of from about 10 seconds to about 20 seconds in a nitrogen environment. Alternatively floating gate polysilicon layer 110 may be deposited directly as polysilicon, for example, by such conventional processes as pyrolyzing silane at an elevated temperature followed by doping, or in yet another alternate embodiment may be deposited directly as doped polysilicon.

Next, doped floating gate polysilicon layer 110 may be patterned, for example, using conventional photolithographic techniques to mask the non-volatile memory section of active mesa area 104. Conventional reactive ion etch ("RIE") or other suitable removal method may be used to remove first doped polysilicon layer 110 where the photoresist pattern is absent, resulting in removal of areas of doped polysilicon layer 110 overlying the non-memory region 106 while leaving a blanket of first doped polysilicon layer 110 overlying the non-volatile memory region 104.

Figure 3:
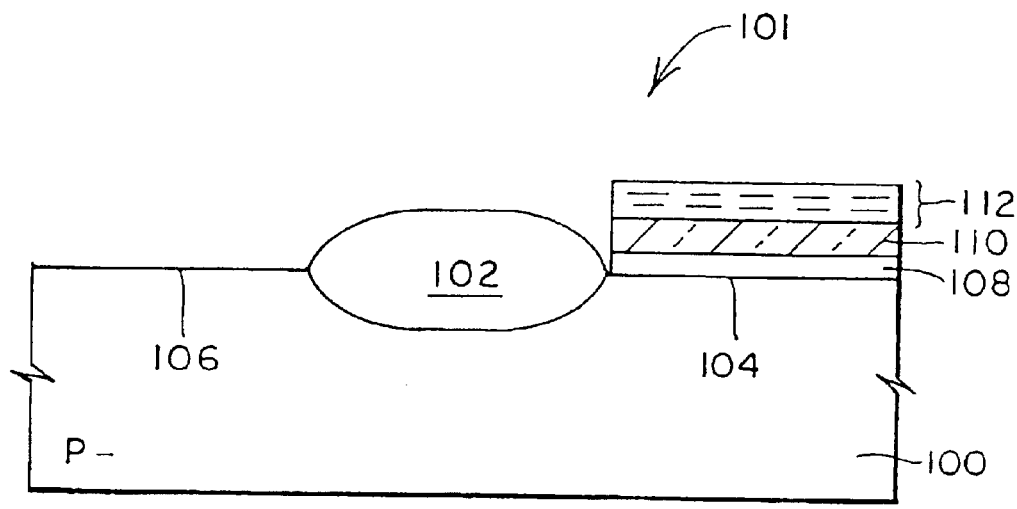
FIG. 3 is a simplified partial cross-sectional view of the semiconductor substrate of FIG. 2 showing memory cell oxide and doped floating gate polysilicon layers removed from a non-memory mesa area of the substrate; and also showing memory cell oxide layer, doped floating gate polysilicon layer and oxide-nitride-oxide layer formed on a non-volatile memory mesa area of the substrate according to one embodiment disclosed herein.

Following patterned etching of floating gate polysilicon layer 110, an oxidenitride-oxide ("ONO") inter-poly oxide layer 112 may be deposited, for example, using conventional thermal CVD methods, and may be patterned using conventional photolithographic techniques. Next, ONO layer 112 may be removed from non-memory active mesa area 106 using conventional RIE or other suitable removal method. When using a conventional RIE method, ONO layer 112 is removed where the photoresist pattern is absent. Following removal from non-memory active area 106, ONO layer 112 remains in the non-volatile memory region 104 as shown in FIG. 3. Although one exemplary embodiment is described above for forming the structure illustrated in FIG. 3, it will be understood that any suitable alternative methodology may be employed.

Next, a thin gate oxide layer 114 may be deposited, for example, as described in U.S. Pat. No. 6,190,973, which is incorporated herein by reference. In one embodiment, gate oxide 114 may be thermally grown by oxidation reaction with the silicon of active non-memory mesa area 106 to have a thickness of from about 80 angstroms to about 130 angstroms, although other thicknesses are possible.

A second amorphous silicon layer for the control gate of non-memory and non-volatile memory sections may next be blanket deposited over the surface of semiconductor device 101 using conventional thermal CVD or other suitable method, and in one embodiment may be deposited by thermal CVD to a thickness of from about 1500 angstroms to about 2500 angstroms, although other thicknesses are possible. Following deposition, the second amorphous silicon layer may be doped with phosphorous or other suitable dopant, for example, using ion implantation. A dopant redistribution and crystallization anneal at suitable conditions to form doped control gate polysilicon layer 116 may be processed, for example, using RTP at a temperature of between about 850° C. and about 950° C. for a time period of from about 10 seconds to about 20 seconds in a nitrogen ambient. Following anneal, surface of control gate polysilicon layer 116 may be chemically cleaned using hydrofluoric acid (HF), standard clean 1 ("SC1") (ammonium hydroxide, hydrogen peroxide and water) and standard clean 2 ("SC2") (hydrochloric acid, hydrogen peroxide and water). As with first doped floating gate polysilicon layer 110, second doped control gate polysilicon layer 116 may be alternatively formed by direct deposition of polysilicon and then doped, or may be directly deposited as doped polysilicon.

Next, a metal silicide (e.g., tungsten silicide or other refractory metal silicide) layer 118 may be deposited on the surface of control gate polysilicon layer 116 using any suitable deposition method. In one embodiment, tungsten silicide layer 118 may be sputter deposited in an argon ambient with a DC bias of from about 1500 watts to about 2500 watts. Any suitable sputter target may be employed, although the sputter target composition in one embodiment may have an atomic ratio of from about 2.5 to about 2.9 silicon atoms to one tungsten atom. Tungsten silicide layer 118 may be deposited to any suitable thickness, in this embodiment to a thickness of from about 500 angstroms to about 2000 angstroms, and alternatively about 1500 angstroms, although other thicknesses are possible. A crystallization anneal may be processed using RTP at a peak temperature of from about 800° C. to about 1100° C., alternatively from about 800° C. to a bout 1000° C. and further alternatively from about 950° C. to about 1050° C., for a time period of from about 30 seconds to about 50 seconds in a nitrogen ambient, although any other suitable temperature, time or combination thereof may be employed. It will be understood that metal silicide layer 118 may alternatively be formed by deposition of refractory metal onto control gate polysilicon layer 116, followed by annealing at a suitable temperature to form metal silicide.

Figure 4:
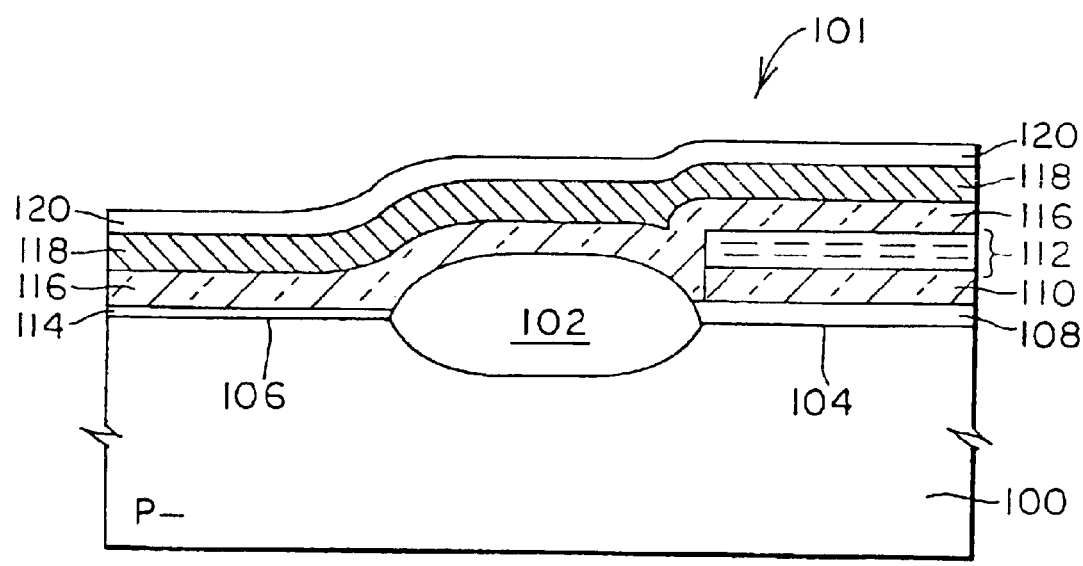
FIG. 4 is a simplified partial cross-sectional view of the semiconductor substrate of FIG. 3 having a control gate polysilicon layer, tungsten silicide layer, and anti-reflective layer formed thereon according to one embodiment disclosed herein.

Next, an inorganic anti-reflective layer ("ARL") 120 may be blanket deposited using, for example, a PECVD reactor or other suitable method. Anti-reflective layer 120 may comprise any inorganic material of a thickness suitable for functioning as an anti-reflective layer, including, but not limited to, a silicon rich oxynitride layer deposited to a thickness from about 200 angstroms to about 400 angstroms, alternatively from about 300 angstroms to about 400 angstroms and further alternatively from about 200 angstroms to about 300 angstroms, although other materials and/or layer thicknesses are possible. In one embodiment, value of the optical constant, complex index refraction, for antireflective layer 120 is from about 2.50–0.50i to about 2.60–0.55i, although other suitable optical constant values are possible. FIG. 4 illustrates semiconductor device 101 following deposition of anti-reflective layer 120.

Next, non-volatile memory sections of semiconductor device 101 may be fabricated, for example, first by masking using conventional I-line photolithography methods followed by etching of the memory stack of the non-volatile memory section using a multi-step RIE method that is commonly referred to as "array etch." The array etch may be used to etch the ARL layer 120, metal silicide layer 118, control gate polysilicon layer 116, ONO layer 112 and doped floating gate polysilicon layer 110 into a self-aligned non-volatile memory stack structure using any suitable etching methodology known to those of skill in the art. For example, the array etch may be a single self-aligned etch performed in a single tool using multiple steps that are tuned or directed to specific materials to be etched, or the array etch may be alternatively accomplished using separate etch steps performed in separate tools or machines for one or more of the separate materials to be etched. Circuit-defining ion implantation steps and conventional sulfuric acid hydrogen peroxide photoresist removal steps may follow the array etch to form heavily doped source/drain regions 126. In the illustrated exemplary embodiment, heavily doped N+ source/drain areas 126 of p-type substrate 100 may be formed using, for example, arsenic ion implantation or doping with any other suitable N-type dopant. A representation of the resultant non-volatile memory stack is shown overlying non-volatile memory active mesa area 104 of FIG. 5A. As with other ion implantation steps of the disclosed method, heavily doped source/drain regions 126 may alternatively be P+ doped regions as may be required by certain doping schemes described herein, e.g., CMOS, PMOS, etc.

Following fabrication of the non-volatile memory section of semiconductor device 101, the non-memory section of semiconductor device 101 may next be fabricated. The non-memory section may also be masked using conventional I-line photolithography methods, and control gates of the non-memory section etched using a polycide RIE method, commonly referred to as "gate etch." Conventional oxygen ash and sulfuric acid/hydrogen peroxide photoresist removal procedures may follow the gate etch. A representation of the non-memory control gate stack is shown overlying non-memory active mesa area 106 in FIG. 5B.

Figure 5A:
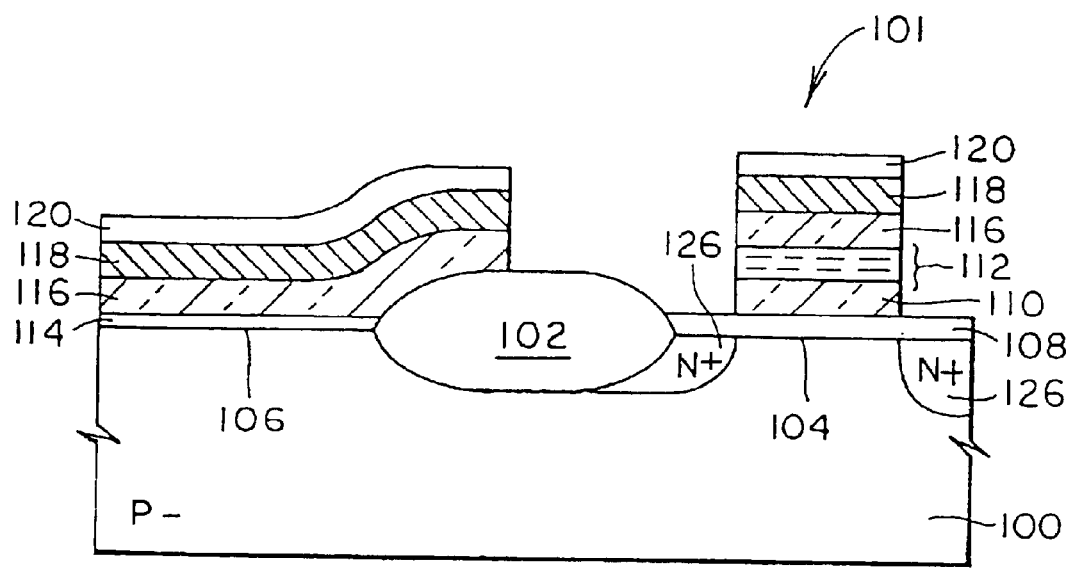
FIG. 5A is a simplified partial cross-sectional view of the semiconductor substrate of FIG. 4 following patterning, etching and source/drain heavy doping to form a non-volatile memory stack according to one embodiment disclosed herein.
Figure 5B:
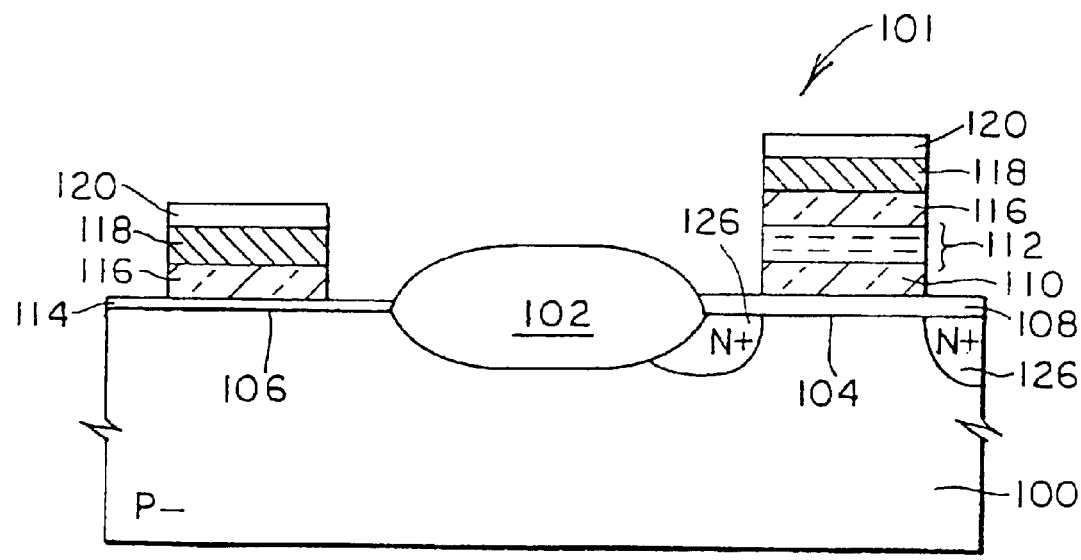
FIG. 5B is a simplified partial cross-sectional view of the semiconductor substrate of FIG. 5A following patterning and etching to form a non-memory control gate stack according to one embodiment disclosed herein.
Figure 5C:
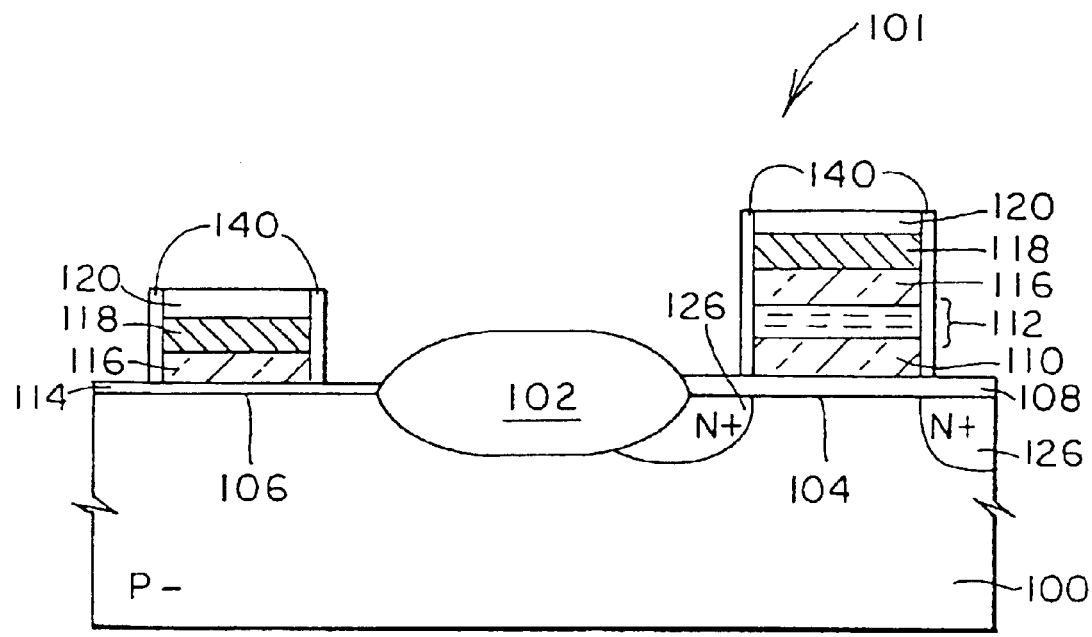
FIG. 5C is a simplified partial cross-sectional view of the semiconductor substrate of FIG. 5B following patterning, etching and growth of a thin oxide on the sides of non-volatile memory stack and non-memory control gate stack according to one embodiment disclosed herein.

Next, a thin oxide layer 140 may be grown to cover the sidewalls of the non-volatile memory stack and non-memory control gate polycide stack, for example, in a furnace tube with an oxidation temperature of from about 800° C. to about 900° C., or under any other suitable conditions. In one embodiment, thin oxide 140 may be grown to a thickness of from about 50 angstroms to about 100 angstroms, although other thicknesses are possible. As illustrated in FIG. 5C, during this step substantially no thin oxide is grown on anti-reflective layer 120. During this step, thickness of gate oxide layers 114 and 108 that remain over the surface of respective active mesa areas 106 and 104 does not substantially change during growth of thin oxide layer 140.

Figure 5D:
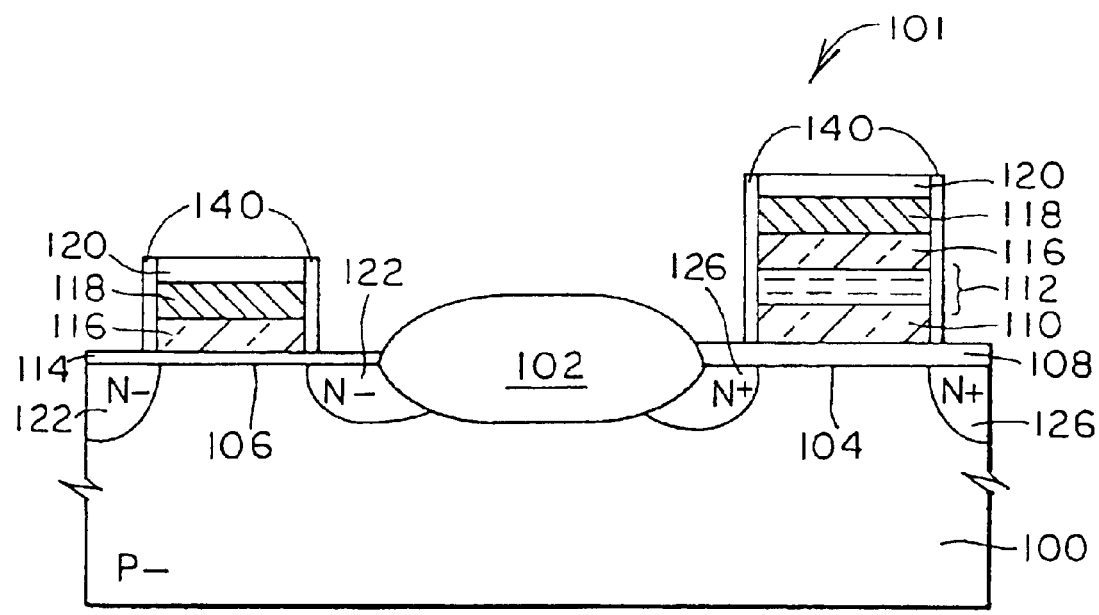
FIG. 5D is a simplified partial cross-sectional view of the semiconductor substrate of FIG. 5C following light doping of source/drain regions of the non-memory control gate stack according to one embodiment disclosed herein.

In the illustrated exemplary embodiment, following growth of thin oxide 140 areas of the semiconductor device 101 are masked with photoresist, and then exposed surfaces of semiconductor device 101 may be doped with N and/or P dopants to provide the desired functionality. For example, as illustrated in FIG. 5D lightly doped N-source/drain 122 regions of non-memory active mesa area 106 may be formed in p-type substrate 100 using, for example, ion implantation of N-type dopants such as phosphorous or any doping with any other suitable N-type dopant. Although not shown, it will be understood that in CMOS device embodiments complementary transistors may be formed by lightly doped P-source/drain regions formed in N-well areas of p-type substrate 100 using, for example, ion implantation of P-type dopants such as boron difluoride. Also possible are CMOS embodiments employing n-type substrates having P-wells, with each having source/drain regions doped to achieve the appropriate functionality. Further, with regard to CMOS device fabrication, it will be understood that implantation sequence of N and P dopants may be performed with either of the N or P dopant implantations being performed first.

Figure 6:
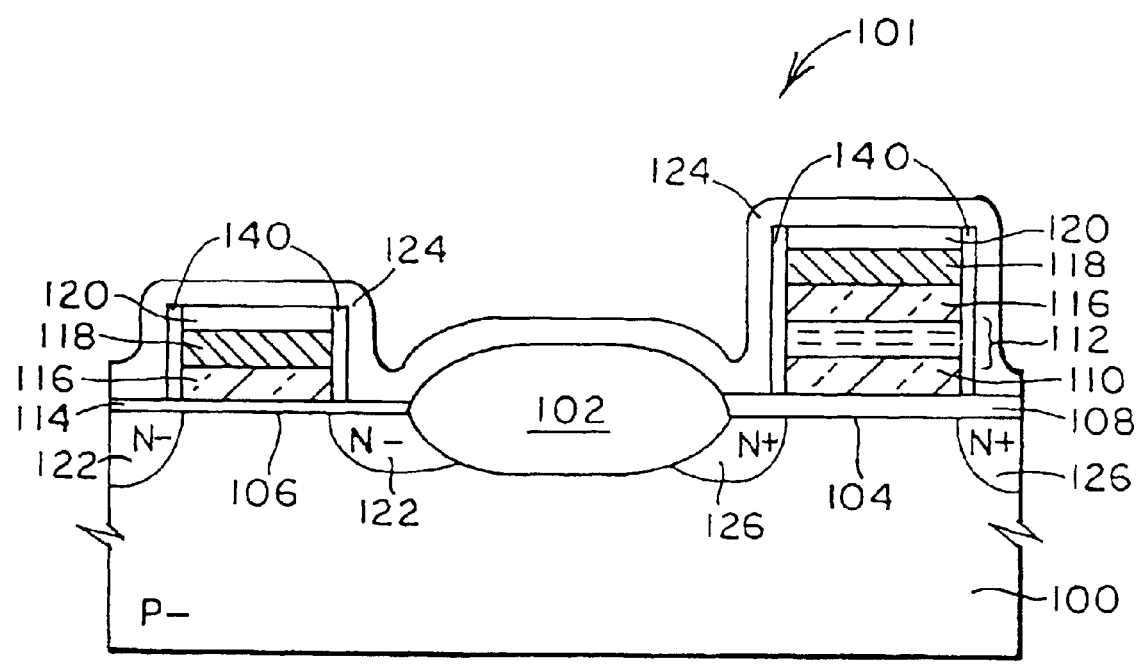
FIG. 6 is a simplified partial cross-sectional view of the semiconductor substrate of FIG. 5 following deposition of a spacer oxide layer according to one embodiment disclosed herein.

Following formation of lightly doped source/drain regions 122, spacer oxide 124 may be formed over the surface of semiconductor device 101 as shown in FIG. 6. Spacer oxide 124 may be formed by any suitable method for example, in a PECVD reactor using TEOS as the precursor and oxygen as the oxidant. In one embodiment, spacer oxide 124 may be deposited to a thickness of from about 1200 angstroms to about 2000 angstroms, alternatively from about 1200 angstroms to about 1600 angstroms and further alternatively from about 1400 angstroms to about 1600 angstroms, although spacer oxide 124 may be formed to have any other suitable thickness outside this range.

Figure 7A:
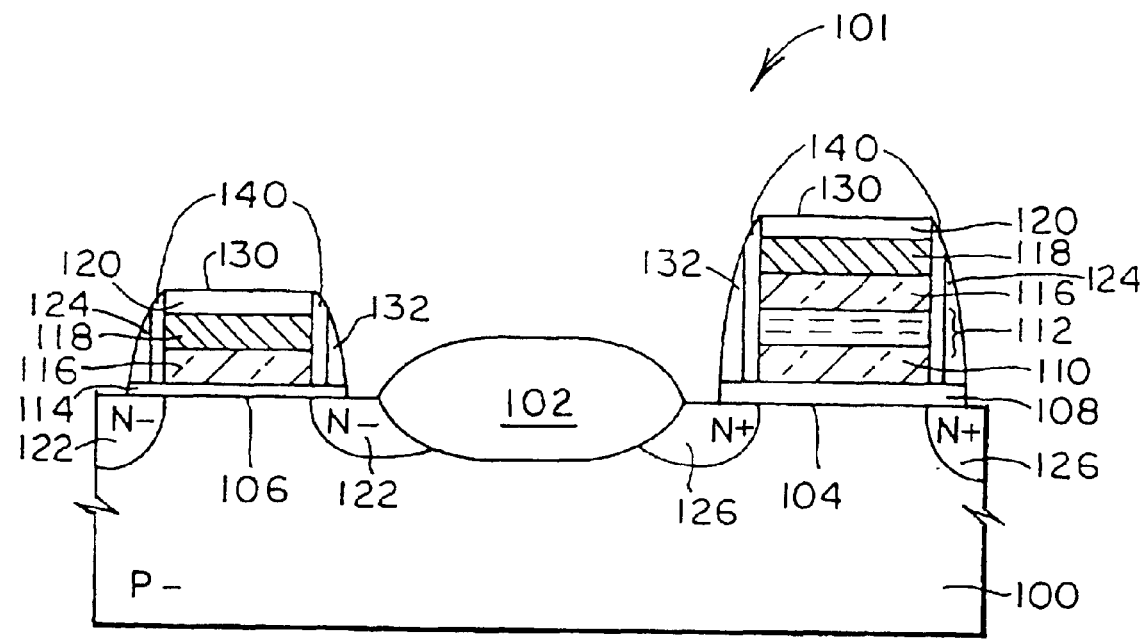
FIG. 7A is a simplified partial cross-sectional view of the semiconductor substrate of FIG. 6 following spacer oxide etch and non-oxidizing spacer densification according to one embodiment disclosed herein.

Following deposition of spacer oxide 124, an RIE blanket etch or other suitable removal method may next be performed to remove spacer oxide from non-volatile memory active mesa area 104 and non-memory active mesa area 106, leaving spacer oxide side layers 132. In one embodiment, a conventional $CF_4/CHF_3$ oxide etch may be performed using a standard oxide etch tool. In this embodiment, the etch is end-pointed when the oxide is removed from active areas 104 and 106, followed by over-etching (e.g., over-etch of about 25 percent), resulting in exposed source and drain areas 122 and 126 as shown in FIG. 7A. As may be seen in FIG. 7A, the RIE blanket etch also is performed to remove material of spacer oxide layer 124 and to optionally remove material of ARL layer 120 from the upper surfaces 130 of the non-volatile memory stack and the non-memory control gate stack, for example, leaving all or part of layer 118 exposed. In this regard, it will be understood that upper surfaces of layer 118 may be completely exposed due to total removal of layer 120, or that all of portions of layer 120 may remain (e.g., after spacer oxide etching layer 120 may have a thickness ranging from about 0 angstroms to substantially unetched original thickness), and that any remaining portions of layer 120 may vary in thickness across upper surfaces 130 of the non-volatile memory stack and the non-memory control gate stack.

Following spacer etch, spacer oxide side layer 132 is densified in a non-oxidizing environment, and without encapsulation of upper surfaces 130 of the non-volatile memory stack and the non-memory control gate stack. Using the disclosed method, spacer densification may be accomplished in the presence of any non-oxidizing ambient species or combination thereof suitable for achieving spacer oxide densification under the conditions required therefor. In one embodiment, the term "spacer densification" may be used to describe exposure of spacer oxide side layers 132 to conditions that include temperature and time sufficient to densify the oxide material in the spacer oxide side layers 132 by increasing the number of Si—O bonds that exist in the deposited oxide (e.g., such as the initially loosely bonded molecular structure of TEOS-deposited oxide). Because the densification is performed in a non-oxidizing ambient, substantially no oxide is grown in the exposed surfaces of non-memory active mesa area 106 and non-volatile memory active mesa area 104, as is the case with conventional spacer densification methodology.

Examples of suitable non-oxidizing species for spacer densification include, but are not limited to, nitrogen, argon, helium, deuterium, combinations thereof (e.g., nitrogen/argon mixture), etc. Spacer oxide densification may be performed using any suitable method for exposing the spacer oxide side layers 132 to elevated temperatures sufficient for densification. In one embodiment, the spacer oxide may be densified using RTP in a nitrogen ambient at a temperature of from about 850° C. to about 1050° C., alternatively from about 900° C. to about 1050° C., further alternatively from about 850° C. to about 950° C. and further alternatively from about 900° C. to about 950° C. for a time period of from about 10 seconds to about 30 seconds, alternatively from about 15 seconds to about 30 seconds, although any other temperature, time, or combination thereof may be employed. Alternatively, densification may be performed in a standard furnace tube in a non-oxidizing ambient (e.g., nitrogen, argon, helium, deuterium, combinations thereof, etc.) or in yet another exemplary embodiment, may be performed in a modified RTP under vacuum.

Figure 7B:
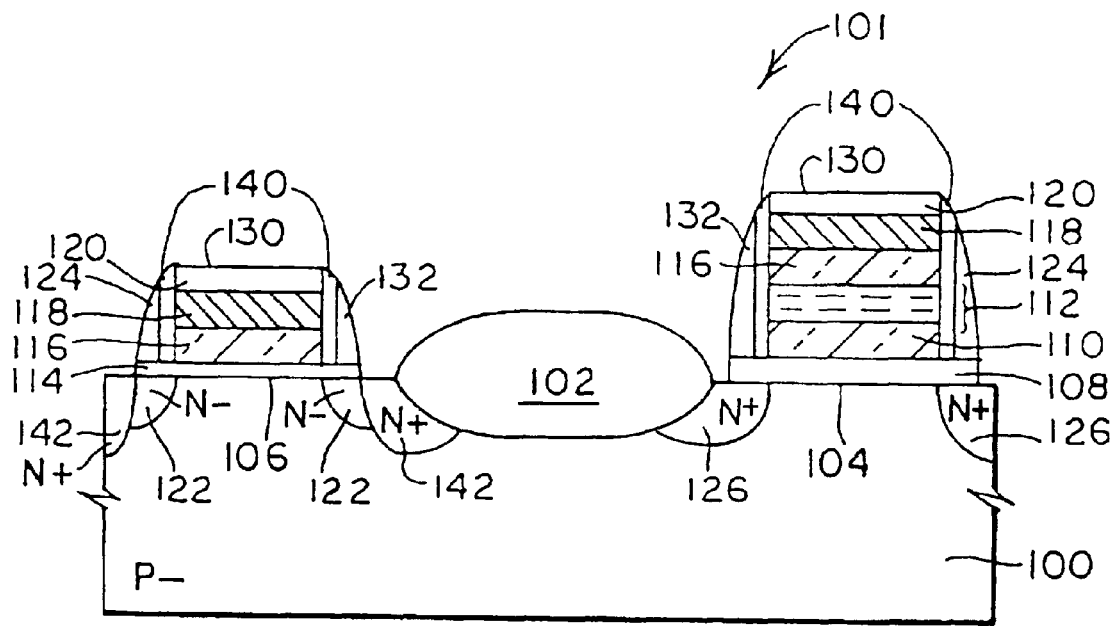
FIG. 7B is a simplified partial cross-sectional view of the semiconductor substrate of FIG. 7A following source/drain heavy doping of the non-memory mesa area according to one embodiment disclosed herein.

Following spacer densification, heavily doped source/drain regions 142 may be formed in non-memory active mesa area 106 as shown in FIG. 7B. In the illustrated exemplary embodiment, heavily doped N+ source/drain areas 142 may be formed using, for example, arsenic ion implantation or doping with any other suitable N-type dopant. As with other ion implantation steps of the disclosed method, heavily doped source/drain regions 142 may alternatively be P+ doped regions as may be required by certain doping schemes described herein, e.g., CMOS, PMOS, etc. Because substantially no oxide is grown in the exposed surfaces of active mesa area 106 during spacer densification, greater control over ion implantation may be advantageously achieved.

Although one exemplary embodiment of the disclosed method using a non-oxidizing spacer densification step to fabricate a CMOS device having embedded non-volatile memory sections has been described above, it will be understood with benefit of the present disclosure that benefits of the disclosed method may be realized in the fabrication of any semiconductor device having one or more conductive polycide structures and that may be subjected to one or more MOSFET spacer densification steps including, but not limited to, other types of CMOS devices, BiCMOS devices, NMOS devices, PMOS devices, etc. Furthermore, it will be understood that the number and type of fabrication steps may vary, and that benefits of the disclosed non-oxidizing spacer densification methodology may be realized using fewer, additional, and/or alternative process steps (including alternative processing conditions) as disclosed in the exemplary embodiment above.

Thus, for example, although particular exemplary embodiments have been illustrated and described herein, it will be understood that source/drain regions 122 and/or 126 of a MOSFET device may be N doped or P doped, as necessary to achieve the desired functionality or functionalities of a semiconductor device 101. In this regard, source and drain regions 122 and/or 126 may be doped with an impurity type different from the type of impurity present in substrate 100 under a respective gate structure. For example, both P channel and N channel MOS devices may be manufactured using the disclosed method, and source/drain regions 122 and/or 126 may be either P doped or N doped accordingly. Alternatively, both P channel and N channel devices may be present on the same semiconductor substrate 100 of semiconductor device 101 as in the manufacture of CMOS devices. Thus, it will be understood that the disclosed process may be employed to manufacture any type of MOSFET device in which polycide may be employed or present including, but not limited to NMOS, PMOS, CMOS, RiCMOS, etc.

In one embodiment, optional additional thermal treatments may be employed to reduce sheet resistance of a metal silicide (e.g., tungsten silicide layer) to a desired value, in one embodiment to a value of from about 6.5 ohms/square to about 9.0 ohms/square. For example, a combination of RTP steps may be employed for this purpose, including RTP steps performed for other purposes such as densification of plasma-deposited insulating oxide layers. With benefit of this disclosure, those of skill in the art will understand that the sequence or combination of such RTP steps should be managed to avoid forming a grain structure, crystalline structure and/or stochiometry that is too difficult to etch using dry-etch methods. It will be further understood that the sequence or combination of such steps should be managed to reduce phosphorus migration from the underlying polysilicon layer into the tungsten silicide layer which may adversely affect the work function character of the control gate.

In another embodiment, a tungsten polycide process may be implemented in an existing CMOS fabrication facility in the following manner. A PVD tungsten silicide chamber may be added to an existing cluster-tool e.g., an Applied Materials ENDURA platform). Such a chamber may use a single tungsten silicide target with a specific Si:W ratio consistent with the desired ratio for the deposited layer, for example, a ratio of from about 2.5:1 to about 2.9:1. One example of such a target is manufactured using powder metallurgy and using, for example, Hot Iso-Static Press ("HIP") and hot press methods. In one exemplary embodiment, such a target may be manufactured from the HIP method so as to achieve 100% nominal density, and to have a structure within the centered target shape that is a matrix of tungsten silicide crystal grains and silicon grains with general grain size of about 50 microns. It will be understood that the foregoing description of tungsten silicide chamber and tungsten silicide target are exemplary only, and that the disclosed method may be employed with other types of tungsten silicide deposition equipment and/or methods, including those described elsewhere herein.

Thus, while the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed method and structures may be utilized in various combinations and/or independently. Thus the invention is not limited to only those combinations shown herein, but rather may include other combinations.

What is claimed is:

1. A method of densifying a spacer oxide at least partially surrounding a polycide structure, said method comprising densifying said spacer oxide in a non-oxidizing ambient; wherein at least a portion of said polycide structure is not encapsulated during said densifying of said spacer oxide.

2. The method of claim 1, wherein said method comprises densifying said spacer oxide by exposing said spacer oxide to an oxide-densifying temperature for a period of time effective to densify said spacer oxide.

3. The method of claim 2, wherein said non-oxidizing ambient comprises a vacuum.

4. The method of claim 2, wherein said non-oxidizing ambient comprises a non-oxidizing gas.

5. The method of claim 4, wherein said non-oxidizing gas comprises at least one of nitrogen, argon, helium, deuterium, or a combination thereof.

6. The method of claim 5, wherein said non-oxidizing gas comprises nitrogen.

7. The method of claim 5, wherein at least a portion of said polycide structure is not encapsulated by silicon oxide or silicon nitride during said densifying of said spacer oxide.

8. The method of claim 7, wherein said polycide comprises tungsten silicide.

9. The method of claim 7, wherein said polycide suffers from substantially no adhesion loss following said densifying.

10. The method of claim 1, wherein said polycide structure comprises a part of a MOSFET semiconductor device.

11. The method of claim 10, wherein said polycide structure comprises a part of a CMOS semiconductor device.

12. The method of claim 10, wherein said polycide structure comprises a non-volatile memory polycide structure; wherein said device further comprises a non-memory polycide structure having a spacer oxide at least partially surrounding said non-memory polycide structure; and wherein said method further comprises densifying said spacer oxide at least partially surrounding said non-memory polycide structure in said non-oxidizing ambient simultaneously with densifying of said spacer oxide at least partially surrounding said non-volatile memory polycide structure.

13. A semiconductor device fabricated at least in part using the method of claim 1.

14. A method of forming a semiconductor structure on a substrate, comprising:
forming a polycide structure comprising at least one polysilicon layer and at least one metal silicide layer;
forming a spacer oxide on said polycide structure, said spacer oxide being formed to at least partially surround said polycide structure; and
densifying said spacer oxide in a non-oxidizing ambient to form said semiconductor structure;
wherein at least a portion of said polycide structure is not encapsulated during said densifying of said spacer oxide.

15. The method of claim 14, wherein said polycide comprises tungsten silicide.

16. The method of claim 15, wherein said non-oxidizing ambient comprises nitrogen gas, and wherein said method comprises densifying said spacer oxide by exposing said spacer oxide to art oxide-densifying temperature for a period of time effective to density said spacer oxide in said nitrogen gas.

17. The method of claim 16, wherein substantially no off-site oxide growth loss occurs due to oxidation of exposed silicon surfaces during said spacer densification.

18. The method of claim 16, wherein said oxide-densifying temperature comprises a temperature of from about 850° C. and about 1050° C.

19. The method of claim 16, wherein said polycide structure comprises a part of a MOSFET semiconductor device.

20. The method of claim 19 wherein said semiconductor structure comprises a non-memory MOSFET control gate structure; and wherein said method further comprises forming a gate oxide on a semiconductor substrate and forming said polycide structure on said gate oxide, said gate oxide and said polycide structure together forming said non-memory control gate structure.

21. The method of claim 19, wherein said polycide structure comprises a part of a CMOS semiconductor device.

22. The method of claim 21, wherein said polycide structure comprises a non-volatile memory polycide structure; wherein said device further comprises a non-memory polycide structure having a spacer oxide at least partially surrounding said non-memory polycide structure; and wherein said method further comprises densifying said spacer oxide at least partially surrounding said non-memory polycide structure in said non-oxidizing ambient simultaneously with densifying said spacer oxide at least partially surrounding said non-volatile memory polycide structure.

23. A semiconductor device fabricated at least in part using the method of claim 14.

24. An integrated semiconductor device comprising a non-volatile memory stack structure and a non-memory control gate stack structure on a silicon substrate, said semiconductor device being fabricated at least in part by a method that comprises:
forming a dielectric isolation region on said silicon substrate, said dielectric isolation region being formed between an active non-volatile memory mesa area and an active non-memory mesa area of said silicon substrate;
forming a memory cell oxide layer on said silicon substrate over said active non-volatile memory mesa area;
forming a doped floating gate polysilicon layer on said memory cell oxide layer over said active non-volatile memory mesa area;
forming an inter-poly oxide layer on said doped floating gate polysilicon layer over said active non-volatile memory mesa area;
forming a thin gate oxide layer on said silicon substrate over said active non-memory mesa area;
forming a doped control gate polysilicon layer on said thin gate oxide of said active non-memory mesa area and on said inter-poly oxide layer of said active non-volatile memory mesa area;
forming a refractory metal silicide layer on said doped control gate polysilicon layer over said active non-volatile memory mesa area so as to form a non-volatile memory stack structure over said active non-volatile memory mesa area;
forming heavily doped non-volatile memory source/drain regions of said non-volatile memory stack structure in said silicon substrate over said active non-volatile memory mesa area;
forming a refractory metal silicide layer on said doped control gate polysilicon layer over said active non-memory mesa area so as to form a non-memory control gate stack structure over said active non-memory mesa area;
forming lightly doped non-memory source/drain regions of said non-memory control gate stack structure in said silicon substrate over said active non-memory mesa area;
forming a spacer oxide side layer on each of said non-volatile memory stack and said non-memory control gate stack structures;
densifying said spacer oxide side layers in a non-oxidizing ambient; and
forming heavily doped non-memory source/drain regions of said non-memory control gate stack structure in said silicon substrate over said lightly doped non-memory source/drain regions.

25. The integrated semiconductor device of claim 24, wherein said integrated semiconductor device is fabricated at least in part by a method that comprises:
forming said dielectric isolation region on said silicon substrate between said active non-volatile memory mesa area and said active non-memory mesa area of said silicon substrate;
then forming a memory cell oxide layer on said silicon substrate over said active non-volatile memory mesa area and said active non-memory mesa area of said silicon substrate;
then forming a doped floating gate polysilicon layer on said memory cell oxide layer;
then removing said doped floating gate polysilicon layer and said memory cell oxide layer from said active non-memory mesa area, leaving said doped floating gate polysilicon layer and said memory cell oxide layer on said active non-volatile memory mesa area;
then forming an inter-poly oxide layer on said doped floating gate polysilicon layer and over said dielectric isolation region and said active non-memory mesa area of said silicon substrate;
then removing said inter-poly oxide layer from said active non-memory mesa area, leaving said doped floating gate polysilicon layer and said inter-poly oxide layer over said active non-volatile memory mesa area;

then forming said thin gate oxide layer on said silicon substrate over said active non-memory mesa area;

then forming said doped control gate polysilicon layer on said thin gate oxide of said active non-memory mesa area and on said inter-poly oxide layer of said active non-volatile memory mesa area;

then forming said refractory metal silicide layer on said doped control gate polysilicon layer;

then forming an anti-reflective layer on said refractory metal silicide layer;

selectively removing areas of said doped floating gate polysilicon layer, said inter-poly oxide layer, said doped control gate polysilicon layer, said refractory metal silicide layer and said anti-reflective layer to form said non-volatile memory stack structure over said active non-volatile memory mesa area;

forming said heavily doped non-volatile memory source/drain regions of said non-volatile memory stack structure in said silicon substrate over said active non-volatile memory mesa area;

selectively removing areas of said doped control gate polysilicon layer, said refractory metal silicide layer and said anti-reflective layer to form said non-memory control gate stack structure over said active non-memory mesa area;

forming said lightly doped non-memory source/drain regions of said non-memory control gate stack structure in said silicon substrate over said active non-memory mesa area;

forming a thin oxide layer on the sidewalls of said non-volatile memory stack and on the sidewalls of said non-memory control gate stack;

forming said spacer oxide side layer on each of said non-volatile memory stack and said non-memory control gate stack structures, and removing at least a portion of each of said cell memory oxide and said thin gate oxide layers in a manner so that at least a portion of each of said heavily doped non-volatile memory source/drain regions, said lightly doped non-memory source/drain regions, said non-volatile memory stack anti-reflective layer and said non-memory control gate stack anti-reflective layer are substantially exposed;

densifying said spacer oxide side layers in a non-oxidizing ambient, wherein at least a portion of each of said heavily doped non-volatile memory source/drain regions, said lightly doped non-memory source/drain regions, said non-volatile memory stack anti-reflective layer and said non-memory control gate stack anti-reflective layer are substantially exposed during said densification; and after said spacer densification forming said heavily doped non-memory source/drain regions of said non-memory control gate stack structure in said silicon substrate over said substantially exposed lightly doped non-memory source/drain regions.

26. The integrated semiconductor device of claim 24, wherein said refractory metal silicide comprises tungsten silicide, and wherein said non-oxidizing ambient comprises nitrogen gas.

27. The integrated semiconductor device of claim 26, wherein said integrated semiconductor device comprises a CMOS semiconductor device.

28. The integrated semiconductor device of claim 27, wherein said integrated semiconductor device comprises a one time programmable CMOS memory device.

29. The integrated semiconductor device of claim 28, wherein said tungsten silicide is formed by sputter deposition.

30. The integrated semiconductor device of claim 29, wherein said anti-reflective layer comprises a layer of silicon oxynitride formed by plasma enhanced chemical vapor deposition.

31. The integrated semiconductor device of claim 29, wherein said sputter deposition of said tungsten silicide is implemented in a conventional CMOS fabrication using a physical vapor deposition tungsten silicide chamber added to a conventional cluster-tool.

32. The integrated semiconductor device of claim 28, wherein said thin oxide layer is thermally grown on the sidewalls of said non-volatile memory stack and said non-memory control gate stack, and wherein substantially no thin oxide layer is thermally grown on the substantially exposed surface of said anti-reflective layer.

33. The integrated semiconductor device of claim 28, wherein said spacer oxide side layers are formed by depositing a layer of spacer oxide using TEOS chemical vapor deposition and then blanket etching said spacer oxide to form said oxide side layers and to substantially remove said oxide layer from surfaces of said non-volatile memory stack anti-reflective layer and said non-memory control gate stack anti-reflective layer; and wherein said etching further comprises overetching to remove at least a portion of said cell memory oxide and said thin gate oxide layers from at least a portion of each of said heavily doped non-volatile memory source/drain regions and said lightly doped non-memory source/drain regions.

34. The integrated semiconductor device of claim 28, wherein during said spacer densification substantially no oxide is grown in the substantially exposed surfaces of said heavily doped non-volatile memory source/drain regions and said lightly doped non-memory source/drain regions.

35. The integrated semiconductor device of claim 26, wherein said spacer densification is performed by rapid thermal processing at a temperature of from about 850° C. and about 1050° C. for a period of time effective to densify said spacer oxide side layers.

36. A method of densifying a spacer oxide at least partially surrounding a polycide structure, said method comprising densifying said spacer oxide in a non-oxidizing ambient, wherein a surface of said polycide structure is exposed to said non-oxidizing ambient during said densifying of said spacer oxide.

37. A semiconductor device fabricated at least in part using the method of claim 36.

38. The method of claim 36, wherein said non-oxidizing ambient comprises at least one of nitrogen, argon, helium, deuterium, or a combination thereof; and wherein said method comprises densifying said spacer oxide by exposing said spacer oxide to an oxide-densifying temperature for a period of time effective to densify said spacer oxide.

39. A method of forming a semiconductor structure on a substrate, comprising:

forming a polycide structure comprising at least one polysilicon layer and at least one metal silicide layer;

forming a spacer oxide on said polycide structure, said spacer oxide being formed to at least partially surround said polycide structure; and densifying said spacer oxide in a non-oxidizing ambient to form said semiconductor structure;

wherein a surface of said polycide structure is exposed to said non-oxidizing ambient during said densifying of said spacer oxide.

40. The method of claim 38, wherein said polycide comprises tungsten silicide, wherein said non-oxidizing ambient comprises nitrogen gas, and wherein said method comprises densifying said spacer oxide by exposing said spacer oxide to an oxide-densifying temperature for a period of time effective to densify said spacer oxide in said nitrogen gas.

41. A semiconductor device fabricated at least in part using the method of claim 39.

* * * * *